United States Patent
Paulsen et al.

(10) Patent No.: US 6,914,786 B1
(45) Date of Patent: Jul. 5, 2005

(54) CONVERTER DEVICE

(75) Inventors: Erik Paulsen, Colorado Springs, CO (US); William Page, Colorado Springs, CO (US); Erich S. Otto, Lafayette, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/881,151

(22) Filed: Jun. 14, 2001

(51) Int. Cl.[7] .............................................. H01R 12/16
(52) U.S. Cl. ...................... 361/790; 361/735; 361/736; 361/767; 257/686
(58) Field of Search ................................ 361/735, 736, 361/790, 794, 795, 761, 764, 767, 760, 803; 438/109; 257/738, 686; 174/260, 52.4, 261

(56) References Cited

U.S. PATENT DOCUMENTS

| | | | | |
|---|---|---|---|---|
| 5,477,933 A | * | 12/1995 | Nguyen | 174/262 |
| 5,483,421 A | * | 1/1996 | Gedney et al. | 361/771 |
| 5,847,929 A | * | 12/1998 | Bernier et al. | 174/52.4 |
| 5,995,379 A | * | 11/1999 | Kyougoku et al. | 361/803 |
| 6,218,202 B1 | * | 4/2001 | Yew et al. | 438/15 |
| 6,272,020 B1 | * | 8/2001 | Tosaki et al. | 174/261 |
| 6,344,684 B1 | * | 2/2002 | Hussain et al. | 257/690 |
| 6,365,839 B1 | * | 4/2002 | Robbins et al. | 174/255 |
| 2002/0135066 A1 | * | 9/2002 | Corisis et al. | 257/738 |
| 2002/0153602 A1 | * | 10/2002 | Tay et al. | 257/685 |

* cited by examiner

*Primary Examiner*—Amir Zarabian
*Assistant Examiner*—Thanh Y. Tran
(74) *Attorney, Agent, or Firm*—Suiter West PC LLO

(57) ABSTRACT

The present invention is directed to a converter device. In a first aspect of the present invention, a converter device includes a board having a first side and a second side. The first side includes a first set of contacts suitable for electrically contacting an integrated circuit having a first configuration. The second side includes a second set of contacts suitable for electrically contacting a circuit board having a second configuration. The second set of contacts is communicatively coupled to the first set of contacts.

5 Claims, 6 Drawing Sheets

| |
|---|
| TOP, 1.50 OZ, ZO = 75.3, WIDTH = 5.0 MILS |
| DIELECTRIC 8.0 MILS, ER = 4.7 |
| GND, 1.00 OZ |
| DIELECTRIC 18.0 MILS, ER = 4.7 |
| 1.00 OZ, SINGAL, ZO - 75.8 OHMS, WIDTH = 4.0 MILS |
| DIELECTRIC 18.0 MILS, ER = 4.7 |
| POWER, 1.00 OZ |
| DIELECTRIC 3.0 MILS, ER = 4.7 |
| GND, 1.00 OZ |
| DIELECTRIC 8.0 MILS, ER = 4.7 |
| BOTTOM, 1.50 OZ, ZO = 75.3, WIDTH = 5.0 MILS |

CONVERTER DEVICE

FIELD OF THE INVENTION

The present invention generally relates to the field of electronic devices, and particularly to a converter device suitable for converting circuit configurations.

BACKGROUND OF THE INVENTION

The development of electronic systems is an involved process. For example, when developing new circuit boards, semiconductors and the like, different portions of an electronic system may be developed at different times. However, it is typically difficult if not impossible to test the system until all of the portions were completed. Therefore, flaws in earlier completed portions of the system may not be tested until other portions were completed, thereby resulting in inefficiencies and delays. Additionally, certain flaws and errors may not be detectable until it is possible to test the system as a whole.

For instance, when testing and developing a new personal computer board, a new integrated circuit designed for that particular board might not yet be available. However, even though the chip is not available, it might still be necessary to develop the board in advance. Therefore, developers were previously required to arrive at different board designs without waiting for the currently unavailable chip, which may require the designers to use less desirable chips and technologies.

Likewise, when testing and developing a new personal computer board, a new board designed for a particular integrated circuit may not yet be available. However, even though the board is not available, it might still be necessary to develop and test the chip in advance.

Therefore, it would be desirable to provide a converter device suitable for converting a board and/or an integrated circuit for operation with devices of different configurations.

SUMMARY OF THE INVENTION

Accordingly, the present invention is directed to a converter device. In a first aspect of the present invention, a converter device includes a board having a first side and a second side. The first side includes a first set of contacts suitable for electrically contacting an integrated circuit having a first configuration. The second side includes a second set of contacts suitable for electrically contacting a circuit board having a second configuration. The second set of contacts is communicatively coupled to the first set of contacts. Contacts having a function configured in the first configuration are not arranged with contacts having a corresponding function configured in the second configuration.

In a second aspect of the present invention, an apparatus includes an integrated circuit, a circuit board and a converter device. The integrated circuit includes a set of contacts, wherein the integrated circuit set of contacts is suitable for operation in a first configuration. The circuit board includes a set of contacts, wherein the circuit board set of contacts is suitable for operation in a second configuration. The converter device is disposed between the integrated circuit and the circuit board. The converter board includes a first set of contacts suitable for contacting the integrated circuit having the first configuration, and a second set of contacts suitable for contacting the circuit board having the second configuration. The first set of contacts is communicatively coupled to the second set of contacts. Contacts of the integrated circuit having a function configured in the first configuration are not arranged with contacts of the circuit board having a corresponding function configured in the second configuration.

In a third aspect of the present invention, an apparatus includes an integrated circuit, a circuit board and a converter device. The integrated circuit includes a set of contacts suitable for operation in a first configuration. The circuit board includes a set of contacts suitable for operation in a second configuration. A converter device is disposed between the integrated circuit and the circuit board. The converter device includes a first set of contacts suitable for contacting the integrated circuit having the first configuration and a second set of contacts suitable for contacting the circuit board having the second configuration. The first set of contacts is electrically coupled to the second set of contacts. The integrated circuit set of contacts includes at least one contact having a function corresponding to a function of a contact of the circuit board. The integrated circuit contact is positioned so that when the integrated circuit is arranged with the circuit board, the integrated circuit contact is not positioned for electrical coupling to the contact of the circuit board having a corresponding function.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIGS. 3C, 3D and 3E are illustrations of exemplary converter board operable to be employed in conjunction to convert a first configuration to a second configuration taking into account routing considerations and the like;

FIG. 4 is an illustration of an exemplary embodiment of the present invention wherein a converter device including multiple converter boards configured as layers, a power layer, and ground layers are shown.

DETAILED DESCRIPTION OF THE INVENTION

Reference will now be made in detail to the presently preferred embodiments of the invention, examples of which are illustrated in the accompanying drawings.

Referring generally now to FIGS. 1 through 4, exemplary embodiments of the present invention are shown. When developing new circuit boards, semiconductors and the like, different portions of an electronic system may be developed at different times. However, it is difficult if not impossible to test the system until all of the portions were completed. Therefore, flaws in earlier completed portions of the system may not be identified until other portions were completed, thereby resulting in inefficiencies and delays. Even though a preexisting integrated circuit, circuit board and the like may be available, the configuration of the preexisting device may be different than the device to be tested, sich as an integrated circuit (IC), circuit board, and other electronic device. Thus, it may be desirable to test and utilize portions of a system with preexisting devices having different configurations by employing a converter device to convert a first configuration to a compatible configuration.

Figure 1A:
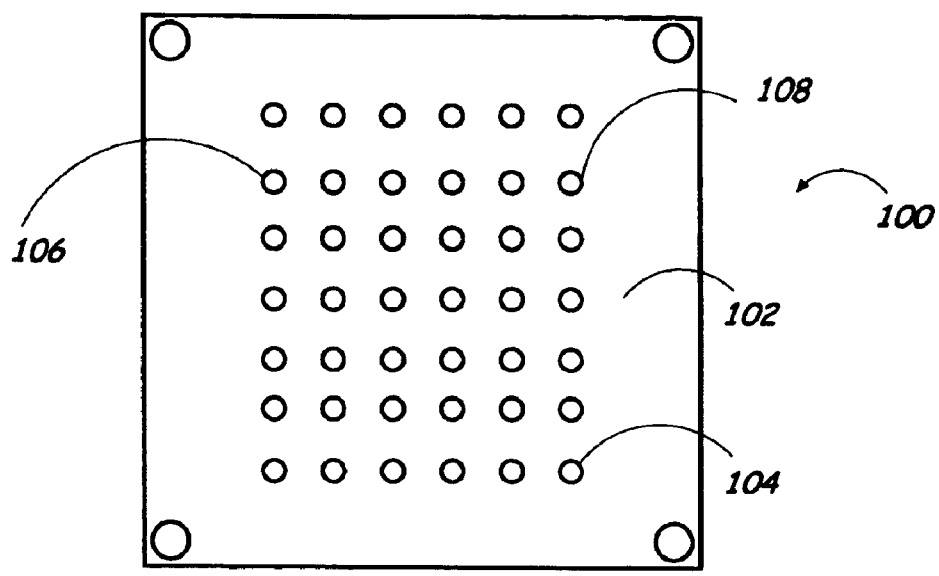
FIG. 1A is an illustration of an exemplary embodiment of the present invention wherein an integrated circuit having a first configuration is shown.
Figure 1B:
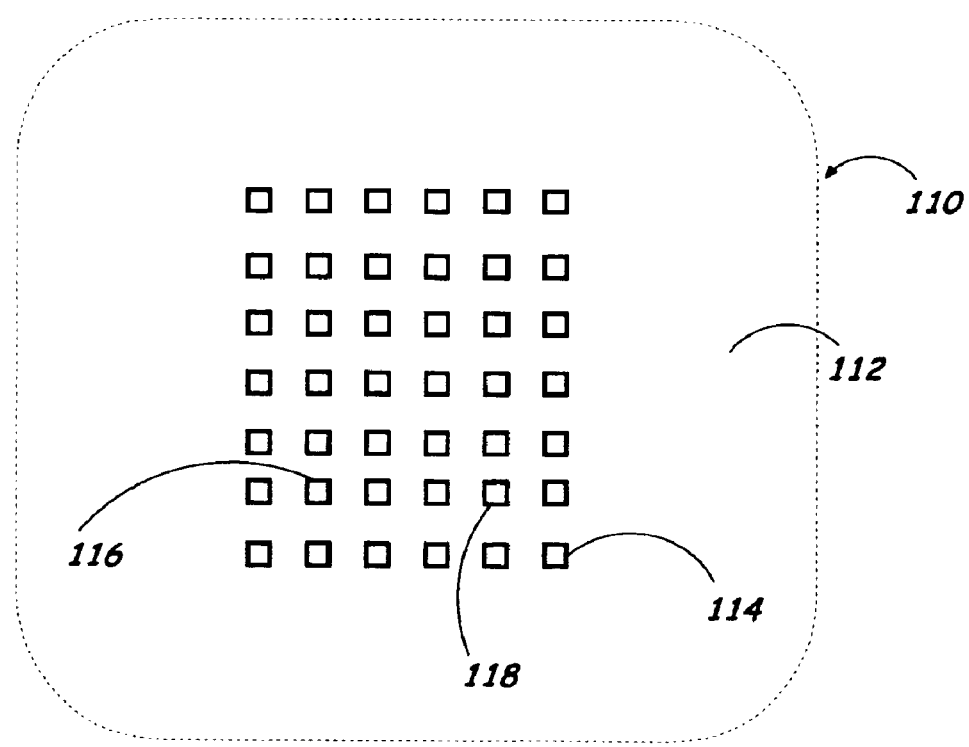
FIG. 1B is an illustration of an embodiment of the present invention is shown wherein a circuit board having a second configuration is incompatible with the first configuration of the integrated circuit shown in FIG. 1A.

Referring now to FIGS. 1A and 1B, an embodiment of the present invention is shown wherein an integrated circuit has a first configuration that is incompatible with a circuit board having a second configuration. An integrated circuit 100 is configured as a ball grid array 102. An integrated circuit as contemplated by the present invention may also include a computer chip, formed in a package and form factor such as to include a chip carrier, and the like without departing from the spirit and scope of the present invention. The integrated circuit 100 includes a plurality of contacts, in this instance solder balls 104, suitable for providing electrical coupling and communication with a circuit board. Contacts may provide a specific function, such as the communication of information and information of a particular type, from the integrated circuit 100 to the printed circuit board. Thus, contacts may be configured so that each contact has a specific function that is communicated through a corresponding contact on a circuit board. In this way, an integrated circuit may have a configuration depending on the arrangement of contacts and corresponding functions of the arranged contacts. For instance, a contact 106 may be configured to provide a first function in a first configuration. However, in certain instances it may be desirable to utilize the integrated circuit with a device having a second configuration, which may be incompatible with the first configuration.

For example, as shown in FIG. 1B, a circuit board 110 includes a substrate 112 having a plurality of contacts 114. The contacts 114 are suitable for providing an electrical pathway and contact with contacts 104 disposed on an integrated circuit 100 (FIG. 1A). However, the configuration of the circuit board 110 is different from the integrated circuit 100. For example, two contacts 106 and 108 (FIG. 1A) having first and second functions respectively, may not be arranged with the corresponding contacts, 116 and 118 having the first and second functions respectively, of the circuit board 110. For instance, such as if the integrated circuit was arranged directly on a circuit board so that the corresponding functions did not align. Thus contacts of the first configuration are out of position with contacts of a second configuration of the circuit board, making the circuit board and integrated circuit incompatible as configured.

Figure 2A:
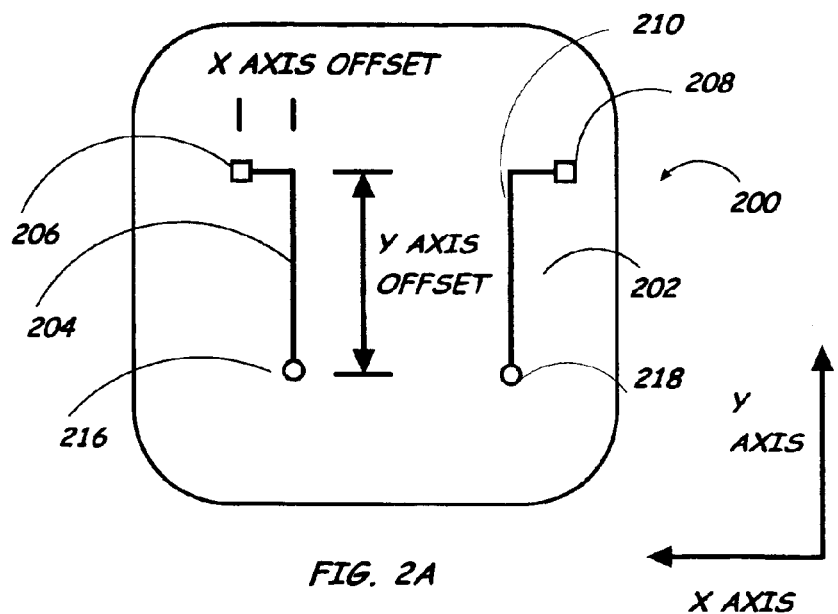
FIGS. 2A and 2B are depictions of a top view and side view, respectively, of an embodiment of the present invention wherein a converter board is utilized to convert a first integrated circuit configuration to a second circuit board configuration.
Figure 2B:
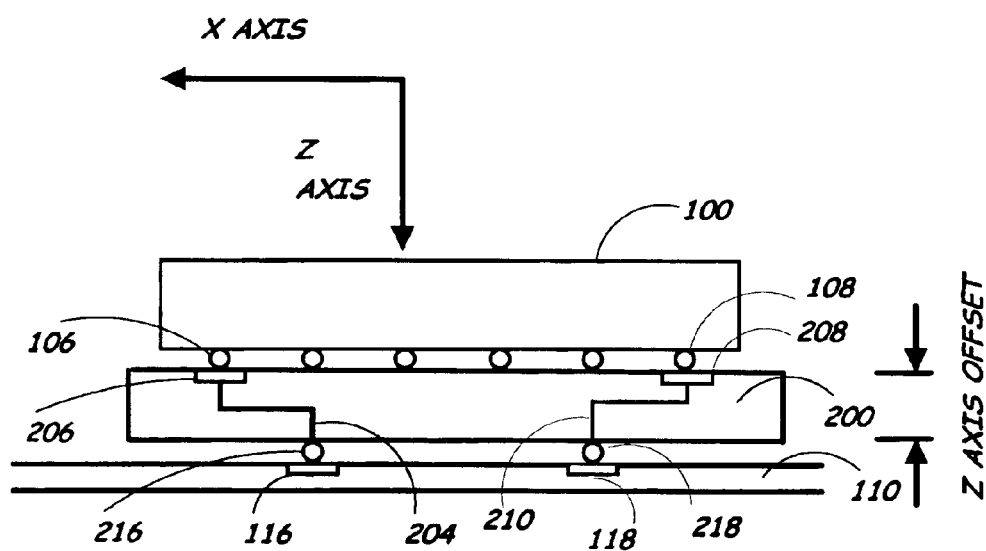

Referring generally now to FIGS. 2A and 2B, an embodiment of the present invention is shown wherein a converter device is utilized to convert a first integrated circuit configuration to a second circuit board configuration. A converter device 200 may be provided to convert a first configuration to a second configuration. The converter device 200 includes a board 202 having a first side and a second side. The first side of the converter board includes contacts 206 and 208 suitable for electrically contacting contacts 106 and 108 of an integrated circuit 100. The second side of the converter board 200 includes a contacts 216 and 218 suitable for electrically contacting contacts 116 and 118 of the circuit board 110. FIG. 2A, the top view of the converter board 200, shows electrical connections 204 and 210 each having an x-axis offset and a y-axis offset. FIG. 2B, the side view of the converter board 200, shows electrical connections 204 and 210 each having a z-axis offset and an x-axis offset. As shown in FIG. 2B, the converter board 200 has a first or top side and a second or bottom side in a parallel relationship. As shown in FIG. 2A, the first and second sides are separated from each other by a thickness of the board (i.e., z-axis offset). The converter board 200 further has third through sixth sides that are parallel to the thickness of the board. The third and fifth sides are parallel to each other, the fourth and sixth sides are parallel to each other, and the third and fourth sides are orthogonal to each other. Contact 206 is electrically connected to a contact 216 such that these two contacts have a non-zero x offset, a non-zero y offset, and a non-zero z offset with respect to each other, as shown in FIGS. 2A and 2B. Also, contact 208 is electrically connected to a contact 218 such that these two contacts have a non-zero x offset, a non-zero y offset, and a non-zero z offset with respect to each other, as shown in FIGS. 2A and 2B. As plainly seen in FIG. 2A, the top view of the converter board, electrical connections 204 and 210 extend within the converter board along the x and y axes. As shown in FIG. 2B, the side view of the converter board, the same electrical connections, 204 and 210, also extend within the converter board along the z axis.

Contacts 206 and 208 are electrically coupled to contacts 216 and 218 respectively, thereby creating electrical pathways from the integrated circuit contacts 106 and 108, to the first set of contacts 206 and 208 respectively, of the converter board 200, along the electrical connections 204 and 210 to the second set of contacts of the converter board 200, the second set of contacts 216 and 218, disposed to make electrical contact with contacts 116 and 118, respectively, of the circuit board 110. Thus, the converter board 200 is disposed between the integrated circuit 100 and the circuit board 110, thereby enabling a first device in a first configuration to electrically couple with a second device in a second configuration, the second configuration incompatible with the first configuration.

Additionally, it should be realized that a converter board and electrical connections, such as connections 204 and 210 (FIGS. 2A and 2B) may extend beyond the boundaries of an integrated circuit, contact area of a circuit board, and the like as required by routing considerations.

Figure 3A:
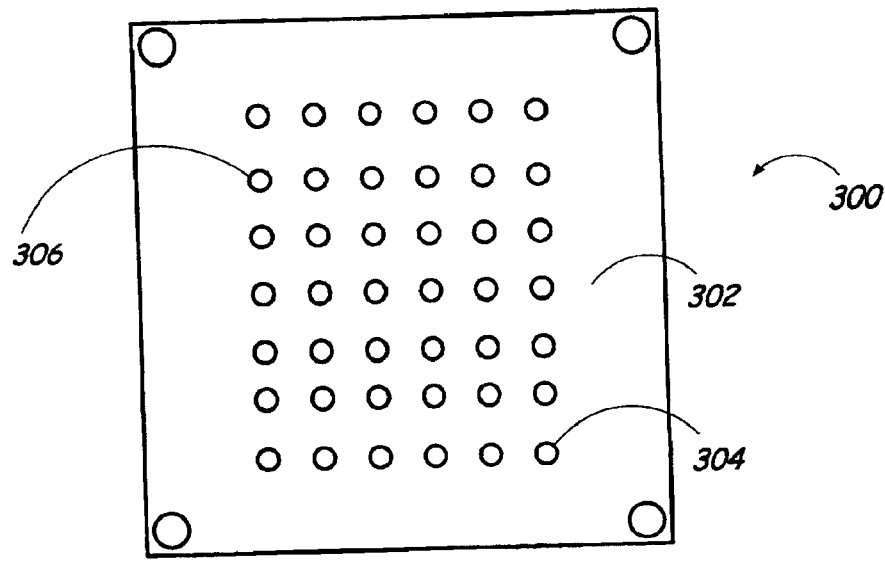
FIG. 3A is an illustration of an exemplary integrated circuit having a first configuration.
Figure 3B:
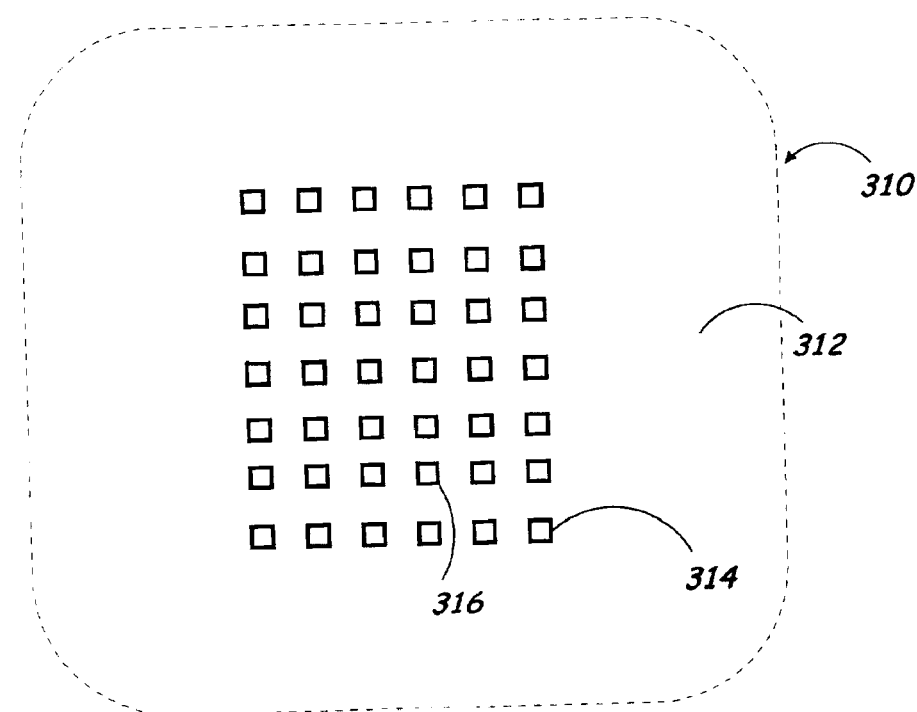
FIG. 3B is an illustration of an exemplary circuit board having a second configuration incompatible with the first configuration of the integrated circuit shown in FIG. 3A.

An integrated circuit 300 configured as a ball grid array 302 includes a plurality of contacts, in this instance solder balls 304, suitable for providing electrical coupling and communication with a circuit board. A contact 306 is included with the integrated circuit 300 that provides a first function. However, as shown in FIG. 3B, a circuit board 310 including a substrate 312 has a plurality of contacts 114 of which, a contact 306 having a function corresponding to the first function of the integrated circuit contact 306 is unreachable by the integrated circuit contact 306. Thus, the configuration of the integrated circuit 300 is incompatible with the configuration of the circuit board 310. For example, contacts of the first configuration may be out of position with contacts of the second configuration of the circuit board. However, due to routing consideration, it may be undesirable or impractical to utilize a single converter board for converting the first configuration to a second configuration. Thus, multiple configuration boards may be utilized to perform the desired conversion.

Figure 3C:
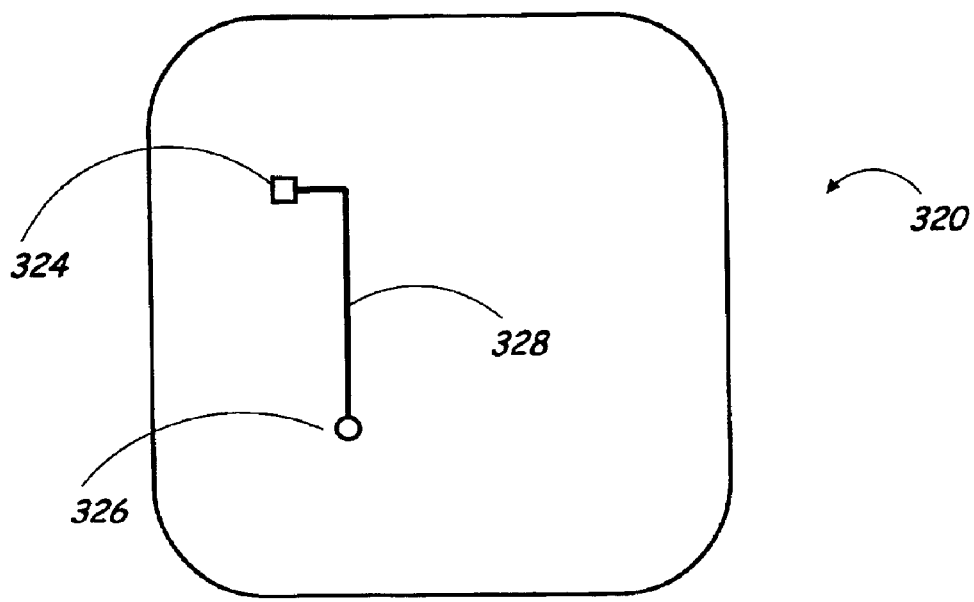
Figure 3D:
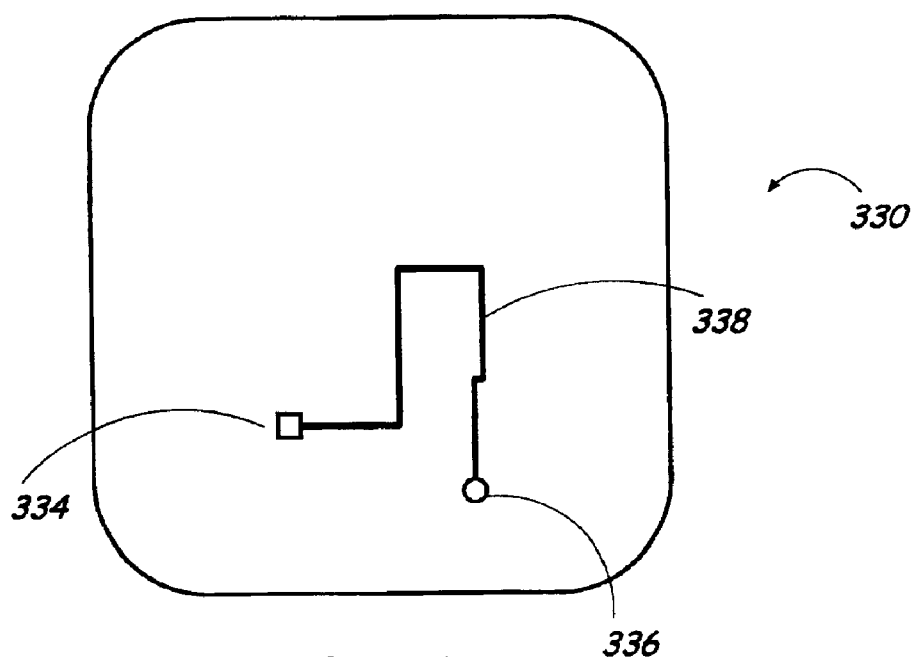
Figure 3E:
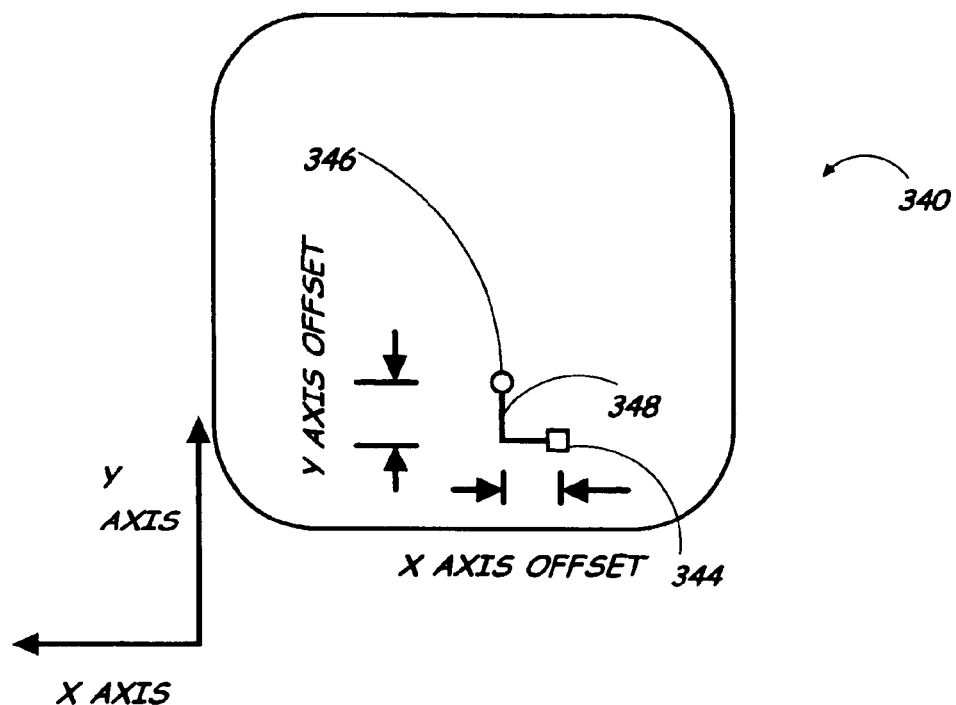

For example, as shown in FIG. 3C, a first converter board 320 may be utilized to provide a first contact 324 positioned for electrically contacting an electrical contact 306 of the integrated circuit 300. A second contact 326 is also provided as an intermediate contact for electrically connecting to a second converter board 330, as shown in FIG. 3D. The second contact 326 is communicatively coupled to the first contact 324 over an electrical connection 328.

Figure 3F:
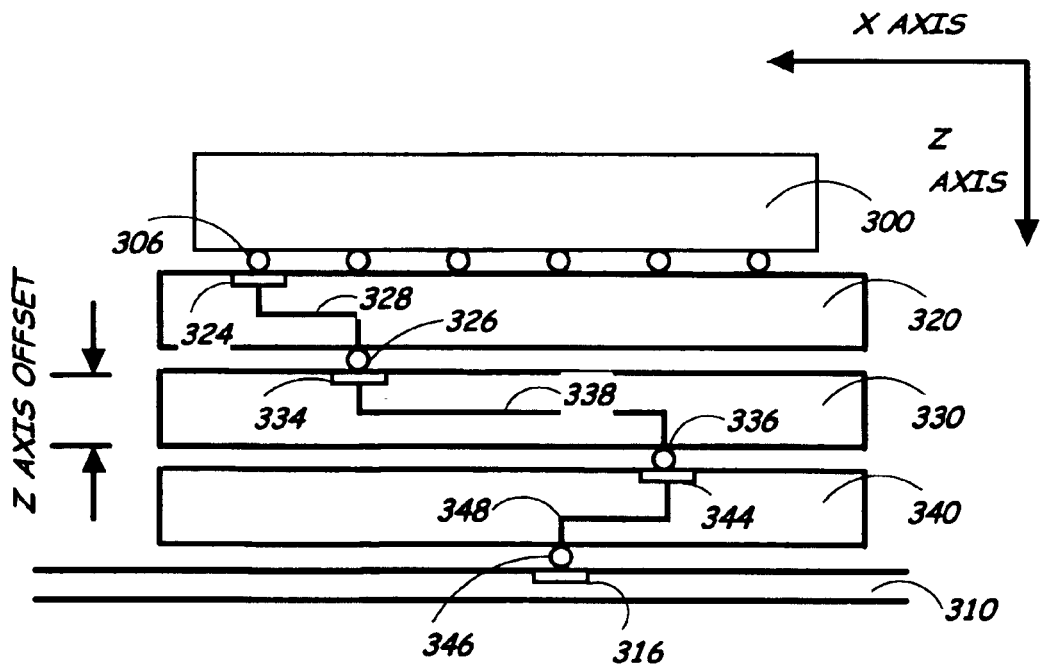
FIG. 3F is a depiction of an exemplary embodiment of the present invention wherein a converter device including multiple converter boards operates to convert a first configuration of an integrated circuit to a second configuration of circuit board.

Likewise, as shown in FIG. 3F, the second converter board 330 includes a third contact 334 positioned for contacting the second contact 326 of the first converter board 320. A fourth contact 336 is electrically connected to the third contact 334 over an electrical connection 338. The fourth contact 336 is positioned in an intermediate position, due to routing considerations and the like, for contacting a third converter board 340. The third converter board 340 includes a fifth contact 344 arranged for contacting the fourth contact 336 of the second converter board 330. The fifth contact 344 is electrically connected 348 to a sixth contact 346, which is disposed on the third converter board 340 to contact the circuit board contact 316 (FIG. 3B). Thus, a device having a first configuration which is unsuitable for direct contact and operation with a device having a second configuration may be converted for operation, such as for testing and the like, with optimized routing. Electrical contacts 306, 326, 336, and 346 are round or spherical and may be solder balls.

Additionally, a converter device may include a power layer, ground layer, and dielectric layers of differing dimensions without departing from the spirit and scope of the present invention, an example of which is shown in FIG. 4. Further, it should be apparent that a converter board may also be configured as a layer of a converter device as shown in FIG. 4.

It is believed that the converter of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An apparatus, comprising:
   a ball grid array integrated circuit having a first configuration of contacts;
   a first round contact in physical and electrical contact with the ball grid array integrated circuit;
   a first converter board in physical and electrical contact with the first round contact;
   a second round contact in physical and electrical contact with the first converter board;
   a second converter board in physical and electrical contact with the second round contact;
   a third round contact in physical and electrical contact with the second converter board;
   a third converter board in physical and electrical contact with the third round contact;
   a fourth round contact in physical and electrical contact with the third converter board; and
   a circuit board in physical and electrical contact with the fourth round contact, the circuit board having a second configuration of contacts not arranged with contacts having a corresponding function configured in the first configuration,
   wherein the ball grid array integrated circuit and the circuit board sandwich the first, second, third, and fourth round contacts and the first, second, and third converter boards;
   wherein the ball grid array integrated circuit is electrically and communicatively coupled through the first round contact, the first converter board, the second round contact, the second converter board, the third round contact, the third converter board, and the fourth round contact to the circuit board.

2. An apparatus as claimed in claim 1, wherein the first converter board includes first and second sets of contacts, the second converter board includes third and fourth sets of contacts and the third converter board includes fifth and sixth sets of contacts, the first set of contacts being communicatively coupled to the second set of contacts through the first converter board, the second set of contacts positioned for contacting the third set of contacts, the third and fourth sets of contacts being communicatively coupled through the second converter board, the fourth set of contacts positioned for contacting the fifth set of contacts, the fifth and sixth sets of contacts being communicatively coupled through the third converter board, wherein the second, fourth and sixth sets of contacts include round contacts.

3. An apparatus as claimed in claim 2, wherein at least one of the first, second and third converter boards and its respective electrical connections extend beyond the boundaries of at least one of the integrated circuit and contact area of the circuit board as required by routing considerations and also extend within at least one of the first, second and third converter boards along two or more of an x, y and z-axis of at least one of the first, second and third converter boards.

4. An apparatus as claimed in claim 2, wherein the second, fourth and sixth sets of contacts include solder balls.

5. An apparatus as claimed in claim 2, wherein the second, fourth and sixth sets of contacts include spherical contacts.

* * * * *